United States Patent
Shimizu et al.

(10) Patent No.: US 10,741,358 B2
(45) Date of Patent: Aug. 11, 2020

(54) ELECTRON MICROSCOPE

(71) Applicant: JEOL Ltd., Tokyo (JP)

(72) Inventors: Yuko Shimizu, Tokyo (JP); Hirofumi Iijima, Tokyo (JP); Naoki Hosogi, Tokyo (JP); Jun Yamashita, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/454,181

(22) Filed: Jun. 27, 2019

(65) Prior Publication Data
US 2020/0013582 A1 Jan. 9, 2020

(30) Foreign Application Priority Data
Jul. 3, 2018 (JP) ................. 2018-126724

(51) Int. Cl.
*H01J 37/22* (2006.01)
*H01J 37/244* (2006.01)
*H01J 37/26* (2006.01)

(52) U.S. Cl.
CPC .......... *H01J 37/222* (2013.01); *H01J 37/244* (2013.01); *H01J 37/26* (2013.01); *H01J 2237/262* (2013.01); *H01J 2237/2614* (2013.01)

(58) Field of Classification Search
None
See application file for complete search history.

(56) References Cited

U.S. PATENT DOCUMENTS

| 5,814,815 A * | 9/1998 | Matsumoto | H01J 37/26 |
| | | | 250/311 |
| 2016/0276125 A1* | 9/2016 | Iijima | H01J 37/04 |

FOREIGN PATENT DOCUMENTS

| JP | 2016170951 A * | 9/2016 | ............ H01J 37/147 |
| JP | 2016170951 A | 9/2016 | |

* cited by examiner

Primary Examiner — Andrew Smyth
(74) Attorney, Agent, or Firm — The Webb Law Firm

(57) ABSTRACT

An electron microscope comprises: an electron microscope main body including a phase plate that imparts a phase change to an electron wave, a moving mechanism that moves the phase plate, and a detector that acquires an image formed by an electron beam transmitted through a sample; and a control unit that controls the electron microscope main body. The control unit performs a phase plate image acquisition process of acquiring a phase plate image which is an image of the phase plate; an unevenness determination process of determining whether or not the phase plate has unevenness based on the phase plate image; and a moving mechanism control process of moving the phase plate by controlling the moving mechanism when the control unit has determined that the unevenness is present.

8 Claims, 6 Drawing Sheets

ELECTRON MICROSCOPE

CROSS-REFERENCE TO RELATED APPLICATION

This application claims priority to Japanese Patent Application No. 2018-126724 filed Jul. 3, 2018, the disclosure of which is hereby incorporated by reference in its entirety.

BACKGROUND OF THE INVENTION

Field of the Invention

The present invention relates to an electron microscope.

Description of Related Art

In recent years, a transmission electron microscope (TEM) equipped with a phase plate has attracted attention because a sample including a large amount of light elements such as living organisms and macromolecules can be observed with high contrast (see, for example, JP-A-2016-170951).

The phase plate changes the phase of an electron wave. The phase plate is disposed, for example, at the back focal plane of an objective lens to change the phases of a transmitted wave and a scattered wave relative to each other. By causing interference of the transmitted wave and scattered wave that underwent such relative phase change, a sample including a large amount of light elements can be observed with high contrast.

Known phase plates include a Zernike phase plate and a hole-free phase plate. In the Zernike phase plate, a thin film made of carbon or the like is provided with holes in the portion through which the transmitted wave passes, and the phase of the scattered wave is changed in the thin-film portion. Meanwhile, in the hole-free phase plate, no hole is provided in the thin film, and the phases of the transmitted wave and the scattered wave are changed relative to each other as a result of the transmitted wave and the scattered wave passing through the thin film. In the hole-free phase plate, the phases of the transmitted wave and the scattered wave are changed relative to each other by partially charging the thin film by an electron beam.

In the hole-free phase plate, where the phase plate has unevenness (thin film), a TEM image having false contrast will be captured.

SUMMARY OF THE INVENTION

The invention can provide an electron microscope capable of acquiring a satisfactory electron microscope image by using a phase plate.

According to one aspect of the invention, there is provided an electron microscope including:

an electron microscope main body including a phase plate that imparts a phase change to an electron wave, a moving mechanism that moves the phase plate, and a detector that acquires an image formed by an electron beam transmitted through a sample; and a control unit that controls the electron microscope main body, the control unit performing:

a phase plate image acquisition process of acquiring a phase plate image which is an image of the phase plate;

an unevenness determination process of determining whether or not the phase plate has unevenness based on the phase plate image; and a moving mechanism control process of moving the phase plate by controlling the moving mechanism when the control unit has determined that the unevenness is present.

DESCRIPTION OF THE INVENTION

According to one embodiment of the invention, there is provided an electron microscope including:

an electron microscope main body including a phase plate that imparts a phase change to an electron wave, a moving mechanism that moves the phase plate, and a detector that acquires an image formed by an electron beam transmitted through a sample; and a control unit that controls the electron microscope main body, the control unit performing:

a phase plate image acquisition process of acquiring a phase plate image which is an image of the phase plate;

an unevenness determination process of determining whether or not the phase plate has unevenness based on the phase plate image; and a moving mechanism control process of moving the phase plate by controlling the moving mechanism when the control unit has determined that the unevenness is present.

In such an electron microscope, when the control unit has determined that the phase plate has unevenness, the control unit can acquire an electron microscope image while avoiding a place where the unevenness is present on the phase plate in order to move the phase plate by controlling the moving mechanism. Therefore, in such an electron microscope, a satisfactory electron microscope image can be easily acquired using the phase plate.

Hereinafter, preferred embodiments of the invention will be described in detail below with reference to the drawings. Note that the embodiments described below do not unduly limit the scope of the invention set forth in the claims. Further, all of the elements described below are not necessarily essential requirements of the invention.

1. First Embodiment

1.1. Electron Microscope

Figure 1:
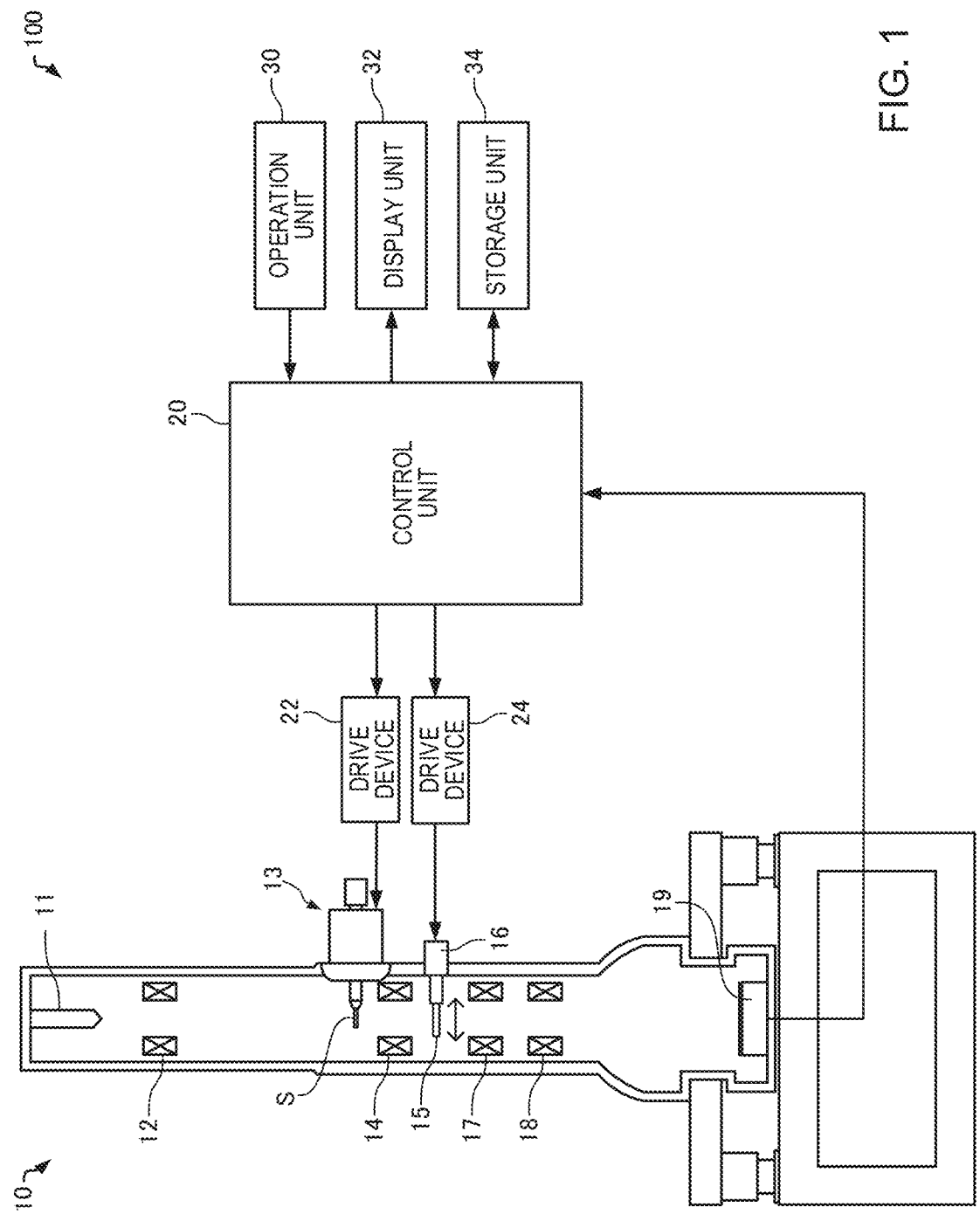
FIG. 1 illustrates a configuration of an electron microscope according to a first embodiment.

First, an electron microscope according to the first embodiment will be described with reference to the drawings. FIG. 1 illustrates a configuration of an electron microscope 100 according to the first embodiment.

As illustrated in FIG. 1, the electron microscope 100 includes an electron microscope main body 10, a control unit 20, an operation unit 30, a display unit 32, and a storage unit 34.

The electron microscope main body 10 includes an electron source 11, a condenser lens 12, a sample stage 13, an objective lens 14, a phase plate 15, a phase plate moving mechanism 16, an intermediate lens 17, a projection lens 18, and a detector 19.

The electron source 11 generates electrons. The electron source 11 is, for example, an electron gun that accelerates electrons emitted from a cathode with an anode and emits an electron beam.

The condenser lens 12 is for irradiating a sample S with the electron beam emitted from the electron source 11. Although not shown, the condenser lens 12 may be composed of a plurality of electron lenses.

The sample stage 13 holds the sample S. The sample S can be positioned by the sample stage 13. The sample stage 13 includes a sample holder for holding the sample S, and a sample holder moving mechanism for moving the sample S by moving the sample holder. The sample stage 13 is controlled by the control unit 20 via a drive device 22.

The objective lens 14 forms an image of a transmission electron microscope image (hereinafter also referred to as a TEM image) with electrons transmitted through the sample S.

The phase plate 15 is disposed at the back focal plane of the objective lens 14. The phase plate 15 changes the phase of the electron wave transmitted through the sample S. The phase plate 15 is a hole-free phase plate. That is, the phase plate 15 has a thin film of carbon or the like, and the transmitted wave and the scattered wave pass through the thin film which results in a relative change of the phases of the transmitted wave and the scattered wave.

In the electron microscope 100, a phase difference image of the sample S can be acquired by observing the sample S by using the phase plate 15. The phase difference image is a TEM image obtained by relatively changing the phases of the transmitted wave and the scattered wave by using the phase plate 15. In the phase difference image, the phase change of an object that is difficult to visualize with a conventional electron microscope can be visualized as a change in intensity.

The phase plate moving mechanism 16 moves the phase plate 15. The phase plate moving mechanism 16 is controlled by the control unit 20 via the drive device 24.

Here, when an electron beam falls on the phase plate 15 for a long time, the state of the phase plate 15 changes. When image capturing is performed using the phase plate 15 after the state thereof has changed, a TEM image having false contrast is obtained. Therefore, in the electron microscope 100, after a certain amount of the electron beam has fallen on the same position of the phase plate 15, the phase plate moving mechanism 16 can be used to move the phase plate 15 in the horizontal direction. As a result, the position where the electron beam falls on the phase plate 15 can be changed, and a satisfactory phase difference image can be obtained.

The intermediate lens 17 and the projection lens 18 further enlarge the image formed by the objective lens 14 and form an image on the detector 19. The objective lens 14, the intermediate lens 17, and the projection lens 18 constitute an imaging system of the electron microscope 100.

The detector 19 is for acquiring a TEM image. The detector 19 is, for example, a digital camera such as a CCD camera.

The operation unit 30 performs a process of converting an instruction from a user into a signal and sending the signal to the control unit 20. The operation unit 30 can be realized by, for example, an input device such as a button, a key, a trackball, a touch panel display, or a microphone.

The display unit 32 outputs the image generated by the control unit 20. The display unit 32 can be realized by, for example, a display such as a liquid crystal display (LCD).

The storage unit 34 stores programs and data for the control unit 20 to perform various calculation processes and control processes. The storage unit 34 is also used as a work area of the control unit 20. The storage unit 34 can be realized by, for example, a random access memory (RAM), a read only memory (ROM), or a hard disk.

The control unit 20 controls the electron microscope main body 10. The functions of the control unit 20 can be realized by executing a program by various processors (central processing unit (CPU) or the like). The processes performed by the control unit 20 will be described hereinbelow.

1.2. Processes

Figure 2:
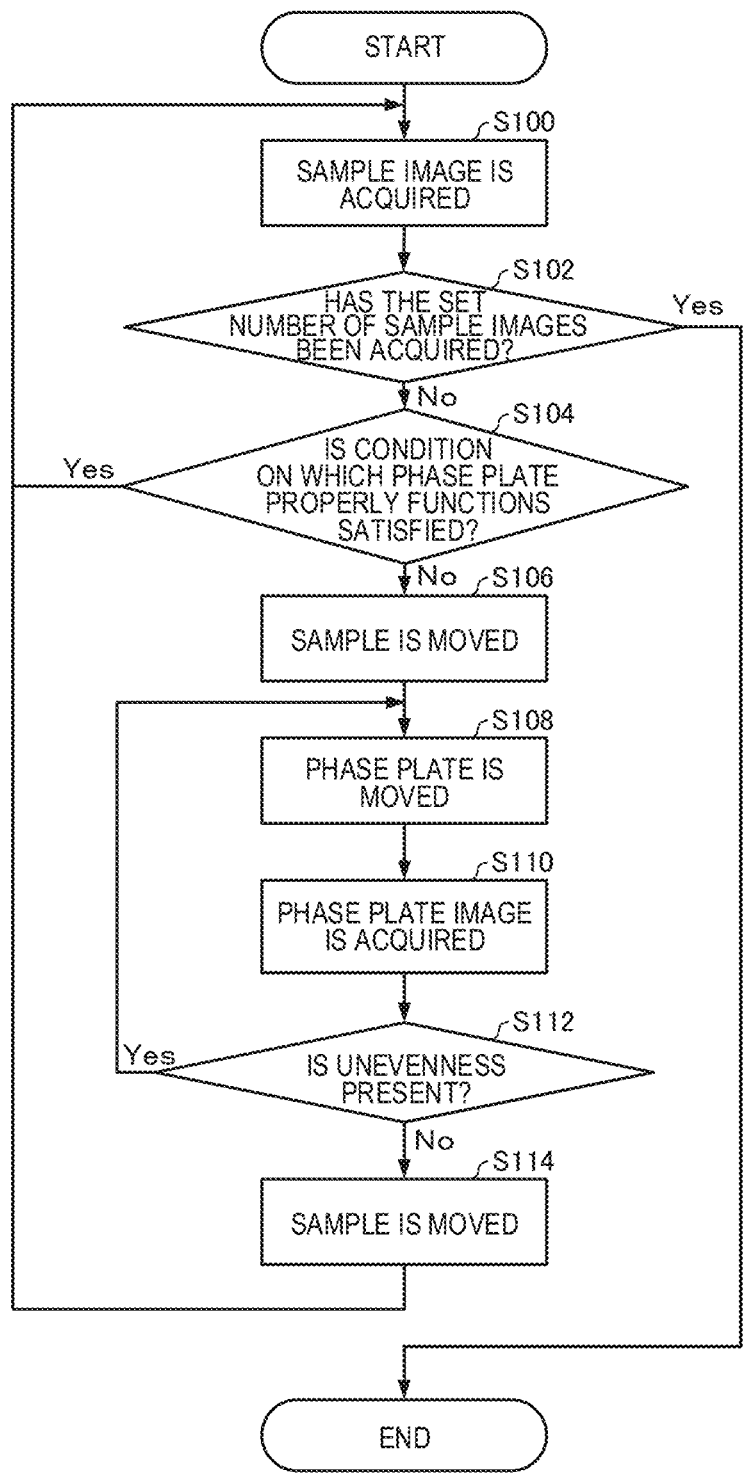
FIG. 2 is a flowchart illustrating an example of processes performed by a control unit of the electron microscope according to the first embodiment.

In the electron microscope 100, the process of acquiring a large number of TEM images (for example, several hundred to several thousand images) can be performed by repeatedly capturing images while moving the sample S. FIG. 2 is a flowchart illustrating an example of processes performed by the control unit 20 of the electron microscope 100.

Before the processes illustrated in FIG. 2 are performed, the user designates a position in the sample S where the phase plate 15 can be easily observed (hereinafter, also referred to as "phase plate observation position"). Since the TEM image of the phase plate 15 (hereinafter also referred to as "phase plate image") includes also the image of the sample S, the phase plate observation position is preferably a position where the influence of contrast of the sample S is small, such as a vacuum position in the sample S or an amorphous region. The user can input the phase plate observation position via the operation unit 30. The information on the inputted phase plate observation position is stored in the storage unit 34.

The user also sets a condition on which the phase plate 15 properly functions. As described above, when an electron beam falls on the phase plate 15 for a long time, the state of the phase plate 15 changes and the phase plate 15 does not function properly. Therefore, whether or not the elapsed time from the start of observation has exceeded a preset time (set time) can be used as a condition on which the phase plate 15 properly functions. For example, the set time can be determined by measuring in advance the interval of time in which the phase plate 15 properly functions. The user can input the condition (set time) on which the phase plate 15 properly functions through the operation unit 30. The inputted information on the condition on which the phase plate 15 properly functions is stored in the storage unit 34.

Whether or not the number of times the TEM image has been taken exceeds a set number of times, or whether or not the dose amount of the electron beam to the phase plate 15 exceeds a set dose amount may be also used as a condition on which the phase plate 15 properly functions.

Where the user issues, via the operation unit 30, an instruction to start the process of acquiring a TEM image of the sample S (hereinafter, also referred to as "sample image"), the control unit 20 starts the process.

First, the control unit 20 acquires a sample image (S100). The control unit 20 controls the sample stage 13 so that the sample S moves to the image capturing position, and acquires a sample image captured by the detector 19. The acquired sample image is stored in the storage unit 34.

Next, the control unit 20 determines whether or not the set number of sample images has been acquired (S102). When the control unit 20 has determined that the set number of sample images has not been acquired (No in S102), the control unit 20 determines whether the condition on which the phase plate 15 properly functions is satisfied (S104).

For example, when the condition on which the phase plate 15 properly functions is whether or not the elapsed time from the start of observation exceeds the set time, the control unit 20 measures the elapsed time from the start of observation by using an incorporated timer for measuring the elapsed time from the start of observation. The control unit 20 determines whether the elapsed time exceeds the set time based on the measurement result of the elapsed time.

When the control unit 20 has determined that the condition on which the phase plate 15 properly functions is satisfied (Yes in S104), the control unit 20 returns to step S100 and, after acquiring a sample image captured at a new image capturing position, performs the processes of step S102 and step S104.

When the control unit 20 has determined that the condition on which the phase plate 15 properly functions is not satisfied (No in S104), the control unit 20 controls the sample stage 13 so that the sample S moves to a phase plate observation position (S106).

Next, the control unit 20 controls the phase plate moving mechanism 16 so that the phase plate 15 moves by the set movement amount (S108). The amount of movement of the phase plate 15 can be set to any value. As a result of moving the phase plate 15 by the set movement amount, a new region of the phase plate 15 is irradiated with the electron beam. Next, the control unit 20 acquires a phase plate image (S110). The control unit 20 acquires the phase plate image captured by the detector 19. At this time, since the sample S is located at the phase plate observation position, the influence of the sample S is small in the obtained phase plate image.

The control unit 20 may change the image capturing condition when capturing the phase plate image to the image capturing condition when capturing a sample image. For example, when capturing a sample image, the lens conditions are such that a crossover is formed on the phase plate 15. However, when capturing a phase plate image, the lens conditions may be such that a crossover is formed at a position deviated from the phase plate 15 by defocusing. As a result, it is possible to confirm easily the unevenness of the phase plate 15 in the phase plate image.

In order to reduce the drift of the phase plate 15 due to the movement of the phase plate 15, the phase plate image may be captured after a predetermined time has elapsed after the phase plate 15 has been moved.

Figure 3:
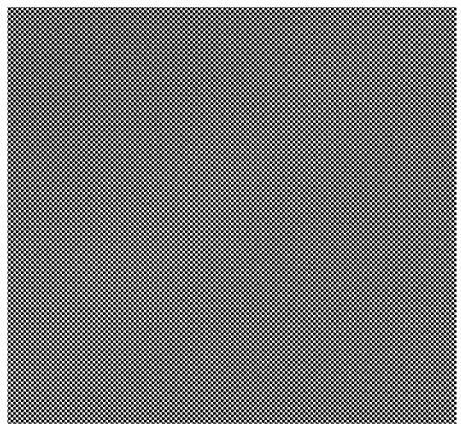
FIG. 3 illustrates a phase plate image when the phase plate has no unevenness.
Figure 4:
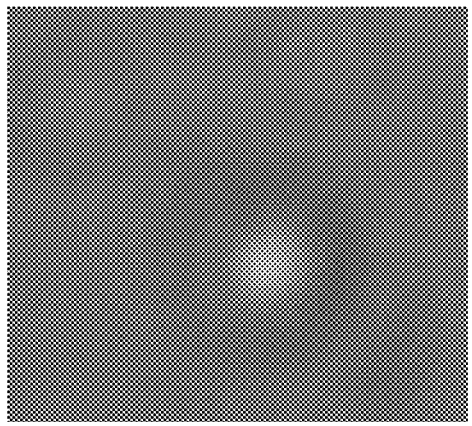
FIG. 4 illustrates a phase plate image when the phase plate has unevenness.

Next, the control unit 20 determines whether or not the phase plate 15 has unevenness based on the phase plate image (S112). The control unit 20 determines the presence or absence of unevenness by whether the phase plate image has a contrast corresponding to the unevenness of the phase plate 15. FIG. 3 is a phase plate image when unevenness is absent on the phase plate 15, and FIG. 4 is a phase plate image when the phase plate 15 has unevenness.

The determination of the presence or absence of unevenness may be performed using, for example, a determination model created by machine learning. For example, in the control unit 20, the determination model may be created in advance by using the phase plate image when the phase plate 15 has unevenness (FIG. 4) and the phase plate image when the phase plate 15 has no unevenness (FIG. 3) as training data.

When the control unit 20 has determined that the phase plate 15 has unevenness (Yes in S112), the control unit 20 returns to step S108 and controls the phase plate moving mechanism 16 so that the phase plate 15 moves by the set movement amount. Then, the control unit 20 acquires the phase plate image again (S110), and determines the presence or absence of unevenness on the phase plate 15 (S112).

When the control unit 20 has determined that the phase plate 15 has no unevenness (No in S122), the control unit 20 controls the sample stage 13 so that the sample S moves from the phase plate observation position to the image capturing position (S114). Then, the control unit 20 returns to step S100 to acquire a sample image captured at a new image capturing position.

When the control unit 20 has determined that the set number of sample images has been acquired (Yes in S102), the control unit 20 ends the process. As described above, the control unit 20 repeatedly performs the processes of steps S100, S102, S104, S106, S108, S110, S112, and S114 described above until the set number of sample images is acquired.

1.3. Features

The electron microscope 100 has, for example, the following features.

In the electron microscope 100, the control unit 20 performs a process of acquiring a phase plate image (phase plate image acquisition process, S110), a process of determining whether or not the phase plate 15 has unevenness based on the phase plate image (unevenness determination process, S112), and a process of moving the phase plate 15 by controlling the phase plate moving mechanism 16 when it is determined that unevenness is present (moving mechanism control process, S108). Thus, in the electron microscope 100, a phase difference image can be acquired while avoiding the place where unevenness is present on the phase plate 15. Therefore, a satisfactory phase difference image can be easily obtained.

In the electron microscope 100, the control unit 20 performs a process of determining whether or not the condition on which the phase plate 15 properly functions is satisfied (condition determination process, S104). Further, when the control unit 20 has determined that the condition on which the phase plate 15 properly functions is satisfied, the control unit 20 performs a process of acquiring a sample image (sample image acquisition process, S100). When it is determined that the condition on which the phase plate 15 properly functions is not satisfied, a process of controlling the phase plate moving mechanism 16 so as to move the phase plate 15 is performed (moving mechanism control process, S108). Thus, in the electron microscope 100, a phase difference image can be acquired while avoiding the place where the state of the phase plate 15 has changed due to the irradiation with the electron beam. Therefore, a satisfactory phase difference image can be easily obtained.

In the electron microscope 100, the control unit 20 performs the phase plate image acquisition process (S110) and the unevenness determination process (S112) after the moving mechanism control process (S108). Further, the control unit 20 performs the sample image acquisition process (S100) when the control unit 20 has determined that no unevenness is present. Thus, in the electron microscope 100, the acquisition of a phase difference image is performed while avoiding the place where the state of the phase plate 15 has changed and the place where unevenness is present on the phase plate 15. Therefore, a satisfactory phase difference image can be easily obtained.

2. Second Embodiment

2.1. Electron Microscope

Next, an electron microscope according to the second embodiment will be described. The configuration of the electron microscope according to the second embodiment is the same as the configuration of the electron microscope 100 illustrated in FIG. 1, and the illustration and explanation thereof is herein omitted.

2.2. Processes

Figure 5:
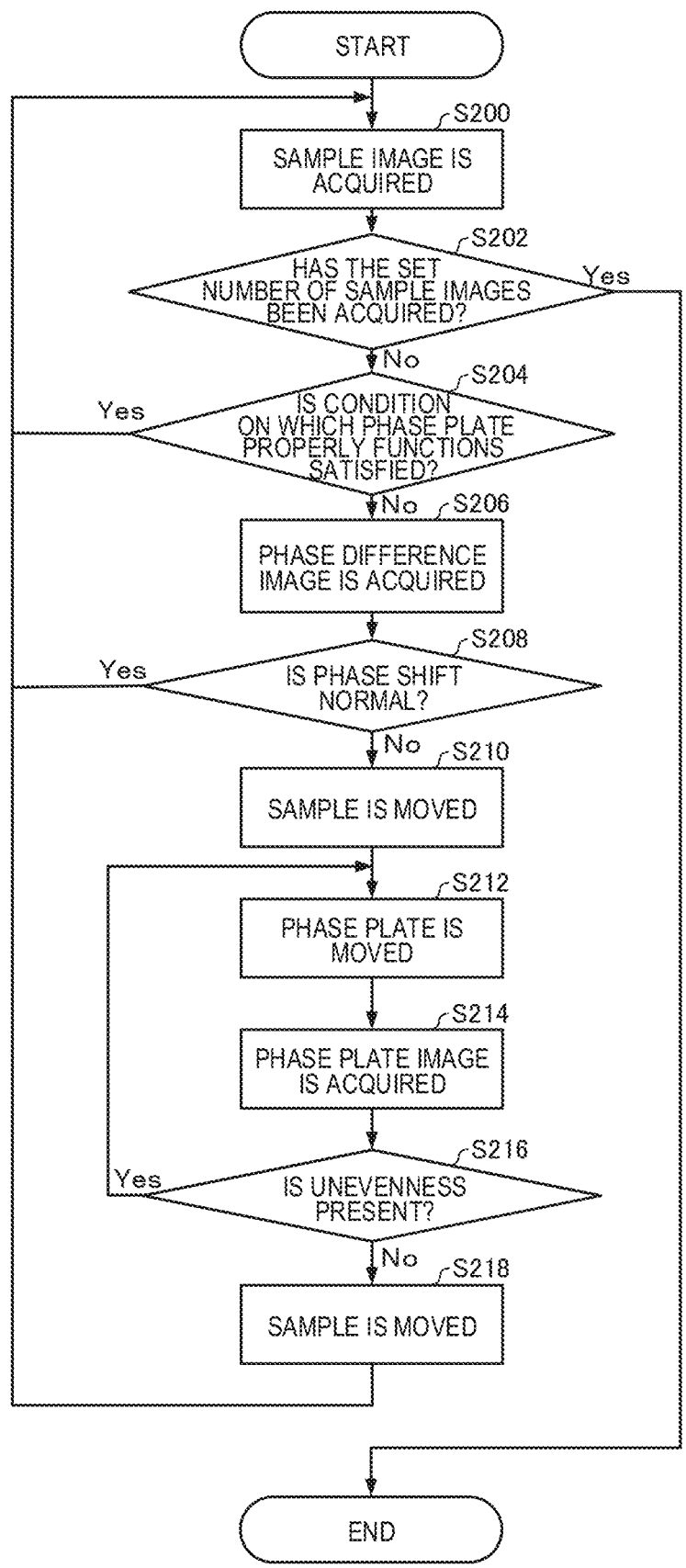
FIG. 5 is a flowchart illustrating an example of processes performed by a control unit of an electron microscope according to a second embodiment.

FIG. 5 is a flowchart illustrating an example of processes performed by the control unit 20 of the electron microscope according to the second embodiment. Points different from those of the above-described processes performed by the control unit 20 and illustrated in FIG. 2 will be described, and the description of the same points will be omitted.

In the first embodiment, as illustrated in FIG. 2, the phase plate 15 is moved when the condition on which the phase plate 15 properly functions is not satisfied (No in S104) (S108). By contrast, in the second embodiment, as illustrated in FIG. 5, the phase plate 15 is moved when the condition on which the phase plate 15 properly functions is not satisfied (No in S204) and the phase shift in the phase difference image is abnormal (No in S208) (S212). Thus, the state of the phase plate 15 can be determined accurately, so that the phase plate 15 can be used efficiently.

Before performing the processes illustrated in FIG. 5, the user sets the phase plate observation position and the condition on which the phase plate 15 properly functions.

When the user issues, through the operation unit 30, an instruction to start the process of acquiring a sample image, the control unit 20 starts the process.

First, the control unit 20 acquires a sample image (S200). Next, the control unit 20 determines whether or not the set number of sample images has been acquired (S202). When the control unit 20 has determined that the set number of sample images has not been acquired (No in S202), the control unit 20 determines whether or not the condition on which the phase plate 15 properly functions is satisfied (S204).

The processes of step S200, step S202, and step S204 are performed in the same manner as the processes of step S100, step S102, and step S104 illustrated in FIG. 2.

Where the control unit 20 has determined that the condition on which the phase plate 15 properly functions is satisfied (Yes in S204), the control unit 20 returns to step S200, and after acquiring a sample image captured at a new image capturing position, performs the processes of step S202 and step S204.

When the control unit 20 has determined that the condition on which the phase plate 15 properly functions is not satisfied (No in S204), the control unit 20 acquires a phase difference image (S206).

The phase difference image acquired at this time is used to determine whether the below-described phase shift caused by the phase plate 15 is normal or abnormal. Therefore, before acquiring the phase difference image, the control unit 20 may control the sample stage 13 so that the sample S is at a position where the phase shift may be easily observed, or may control the optical system (objective lens 14 or the like) so as to realize an observation condition such that the phase shift is easy to observe.

Next, the control unit 20 determines whether the phase shift in the phase plate 15 is normal or abnormal based on the phase difference image (S208).

The determination of whether the phase shift is normal or abnormal may be performed using a determination model created by machine learning. For example, the control unit 20 may create in advance a determination model by using, as training data, a phase difference image when the phase shift by the phase plate 15 is normal and a phase difference image when the phase shift by the phase plate 15 is abnormal.

When the control unit 20 has determined that the phase shift by the phase plate 15 is normal (Yes in S208), the control unit 20 returns to step S200, and after acquiring a sample image captured at a new image capturing position, performs the processes of steps S202, step S204, step S206 and step S208.

When the control unit 20 has determined that the phase shift by the phase plate 15 is abnormal (No in S208), the control unit 20 controls the sample stage 13 so that the sample S moves to the phase plate observation position (S210). Next, the control unit 20 controls the phase plate moving mechanism 16 so that the phase plate 15 moves by the set movement amount (S212), and acquires a phase plate image (S214). Next, the control unit 20 determines whether or not the phase plate 15 has unevenness based on the phase plate image (S216).

When the control unit 20 has determined that the phase plate 15 has unevenness (Yes in S216), the control unit 20 returns to step S212 and controls the phase plate moving mechanism 16 so that the phase plate 15 moves by the set movement amount. Then, the control unit 20 acquires the phase plate image again (S214), and determines the presence or absence of unevenness on the phase plate 15 (S216).

When the control unit 20 has determined that the phase plate 15 has no unevenness (No in S216), the control unit 20 controls the sample stage 13 so that the sample S moves from the phase plate observation position to the image capturing position (S218). Then, the control unit 20 returns to step S200 and acquires a sample image captured at a new image capturing position.

The above-described processes of step S210, step S212, step S214, step S216, and step S218 are performed in the same manner as the processes of step S106, step S108, step S110, step S112, and step S114 illustrated in FIG. 2.

When the control unit 20 has determined that the set number of sample images has been acquired (Yes in S202), the control unit 20 ends the processes. As described above, the control unit 20 repeatedly performs the processes of steps S200, S202, S204, S206, S208, S210, S212, S214, S216, and S218 described above until the set number of sample images is acquired.

2.3. Features

The electron microscope according to the second embodiment has, for example, the following features.

In the electron microscope according to the second embodiment, as in the electron microscope according to the first embodiment, the phase plate image acquisition process (S214), the unevenness determination process (S216), and the moving mechanism control process (S212) are included. Therefore, a satisfactory phase difference image can be easily acquired.

In the electron microscope according to the second embodiment, the control unit 20 performs the process (phase shift determination process, S208) of determining whether the phase shift by the phase plate 15 is normal or abnormal, and when the control unit has determined that the phase shift is abnormal, the control unit performs the moving mechanism control process (S212). By performing the phase shift determination process (S208) in such a manner, the state of the phase plate 15 can be determined accurately and the moving mechanism control process (S212) can be performed at an appropriate timing. Therefore, the phase plate 15 can be used efficiently without moving the phase plate 15 unnecessarily.

For example, in the first embodiment, the determination is made based on whether or not the condition on which the phase plate 15 properly functions is satisfied. Thus, the first embodiment does not stipulate the measurement as to whether or not the phase shift by the phase plate 15 is abnormal. The resulting problem is that although the phase plate 15 is functioning properly, the phase plate 15 is often moved and the phase plate 15 cannot be used efficiently. By contrast, in the second embodiment, since it is determined whether the phase shift by the phase plate 15 is actually normal or abnormal, such a problem does not occur. Therefore, the phase plate 15 can be used efficiently.

In the electron microscope according to the second embodiment, the control unit 20 performs the phase plate image acquisition process (S214) and the unevenness determination process (S216) after the moving mechanism control process (S212). Further, when the control unit 20 has determined that no unevenness is present, the control unit 20 performs the sample image acquisition process (S200). Therefore, since the acquisition of the phase difference image is performed while avoiding the place where the state of the phase plate 15 has changed and the place where unevenness is present on the phase plate 15, a satisfactory phase difference image can be easily acquired.

Here, when it is determined whether the phase shift by the phase plate 15 is normal or abnormal based on the phase difference image, the phase difference image needs to be acquired and time is required for the determination. By contrast, whether or not the condition on which the phase plate 15 properly functions can be determined in a short time. Therefore, in the electron microscope according to the second embodiment, the control unit 20 performs the process (condition determination process, S204) of determining whether or not the condition on which the phase plate 15 properly functions is satisfied, and when the control unit 20 has determined that this condition is not satisfied, the control unit 20 performs the phase shift determination process (S208). Therefore, the number of times the phase shift determination process is performed can be reduced as compared with, for example, the case where the phase shift determination process is performed without performing the condition determination process (for example, refer to FIG. 6 described hereinbelow). As a result, a large number of phase difference images can be acquired in a short time.

3. Third Embodiment 3.1. Electron Microscope

Next, an electron microscope according to the third embodiment will be described. The configuration of the electron microscope according to the third embodiment is the same as the configuration of the electron microscope 100 illustrated in FIG. 1, and the illustration and explanation thereof is herein omitted.

3.2. Processes

Figure 6:
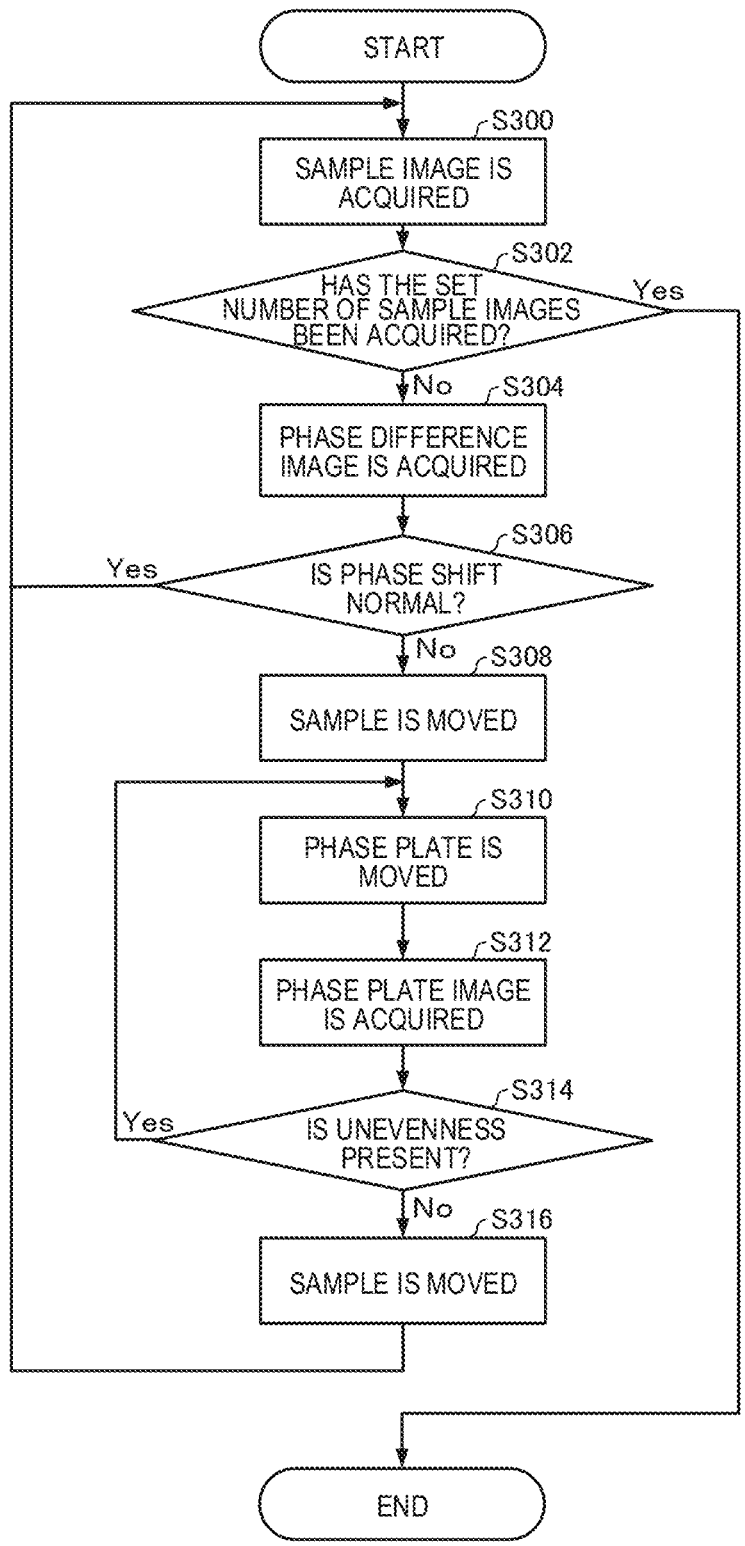
FIG. 6 is a flowchart illustrating an example of processes performed by a control unit of an electron microscope according to a third embodiment.

FIG. 6 is a flowchart illustrating an example of processes performed by the control unit 20 of the electron microscope according to the third embodiment. Points different from those of the above-described processes performed by the control unit 20 and illustrated in FIGS. 2 and 5 will be described, and the description of the same points will be omitted.

In the first embodiment, as illustrated in FIG. 2, the phase plate 15 is moved when the condition on which the phase plate 15 properly functions is not satisfied (No in S104) (S108). By contrast, in the third embodiment, as illustrated in FIG. 6, the phase plate 15 is moved when the phase shift in the phase difference image is abnormal (No in S306) (S310). Thus, the phase plate 15 can be used efficiently as in the second embodiment.

Further, in the second embodiment, as illustrated in FIG. 5, it is determined whether or not the condition on which the phase plate 15 properly functions is satisfied (S204), but in the third embodiment, this process is not performed. The process can thus be simplified.

Before performing the process illustrated in FIG. 6, the user sets the phase plate observation position. When the user issues an instruction (operation) to start the process of acquiring a sample image through the operation unit 30, the control unit 20 starts the process.

First, the control unit 20 acquires a sample image (S300). Next, the control unit 20 determines whether or not the set number of sample images has been acquired (S302). The processes of step S300 and step S302 are performed in the same manner as the processes of step S100 and step S102 illustrated in FIG. 2.

When the control unit 20 has determined that the set number of sample images has not been acquired (No in S302), the control unit 20 acquires a phase difference image (S304). Next, the control unit 20 determines whether the phase shift in the phase plate 15 is normal or abnormal based on the phase difference image (S306). The processes of step S304 and step S306 are performed in the same manner as the processes of step S206 and step S208 illustrated in FIG. 5.

When the control unit 20 has determined that the phase shift by the phase plate 15 is normal (Yes in S306), the control unit 20 returns to step S300, acquires a sample image captured at a new image capturing position, and then performs step S302, step S304, and step S306.

When the control unit 20 has determined that the phase shift by the phase plate 15 is abnormal (No in S306), the control unit 20 controls the sample stage 13 so that the sample S moves to the phase plate observation position (S308). Next, the control unit 20 controls the phase plate moving mechanism 16 so that the phase plate 15 moves by the set movement amount (S310), and acquires a phase plate image (S312). Next, the control unit 20 determines whether or not the phase plate 15 has unevenness based on the phase plate image (S314). When the control unit 20 has determined that the phase plate 15 has unevenness (Yes in S314), the control unit 20 returns to step S310 and controls the phase plate moving mechanism 16 so that the phase plate 15 moves by the set movement amount. Then, the control unit 20 acquires the phase plate image again (S312), and determines the presence or absence of unevenness on the phase plate 15 (S314).

When the control unit 20 has determined that the phase plate 15 has no unevenness (No in S314), the control unit 20 controls the sample stage 13 so that the sample S moves from the phase plate observation position to the image capturing position (S316). Then, the control unit 20 returns to step S300 and acquires a sample image captured at a new image capturing position.

The processes of step S308, step S310, step S312, step S314, and step S316 described above are performed in the same manner as the processes of step S106, step S108, step S110, step S112, and step S114 illustrated in FIG. 2.

When the control unit 20 has determined that the set number of sample images has been acquired (Yes in S302), the control unit 20 ends the processing. As described above, the control unit 20 repeatedly performs the processes of steps S300, S302, S304, S306, S308, S310, S312, S314, and S316 described above until the set number of sample images is acquired.

3.3. Features

The electron microscope according to the third embodiment has, for example, the following features.

In the electron microscope according to the third embodiment, as in the electron microscope according to the first embodiment, the phase plate image acquisition process (S312), the unevenness determination process (S314), and the moving mechanism control process (S310) are included. Therefore, a satisfactory phase difference image can be easily acquired.

In the electron microscope according to the third embodiment, as in the electron microscope according to the second embodiment, the control unit 20 performs the phase shift determination process (S306), and when the control unit 20 has determined that the phase shift is abnormal, the control unit 20 performs the moving mechanism control process (S310). Therefore, the phase plate 15 can be used efficiently.

4. Fourth Embodiment 4.1. Electron Microscope

Next, an electron microscope according to the fourth embodiment will be described. The configuration of the electron microscope according to the fourth embodiment is the same as the configuration of the electron microscope 100 illustrated in FIG. 1, and the illustration and explanation thereof is herein omitted.

4.2. Processes

Figure 7:
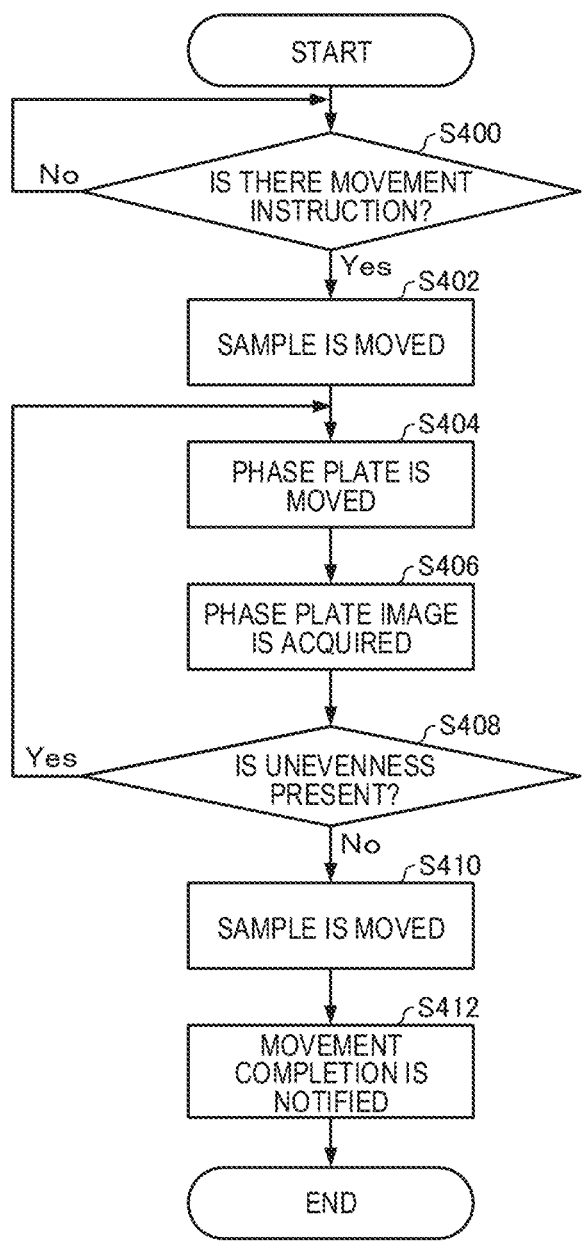
FIG. 7 is a flowchart illustrating an example of processes performed by a control unit of an electron microscope according to a fourth embodiment.

FIG. 7 is a flowchart illustrating an example of processes performed by the control unit 20 of the electron microscope according to the fourth embodiment. Points different from those of the above-described processes performed by the control unit 20 and illustrated in FIGS. 2, 5 and 6 will be described, and the description of the same points will be omitted.

In the electron microscopes according to the first to third embodiments, the case where the control unit 20 automatically acquires a sample image has been described. However, in the electron microscope according to the fourth embodiment, the control unit 20 performs the processing until the phase plate 15 is moved to the position where unevenness is not present, and the acquisition of sample images is not performed.

The control unit 20 determines whether or not the user has issued an instruction to move the phase plate 15 (hereinafter also referred to as "movement instruction") (S400), and stands by until a movement instruction is issued (No in S400). The control unit 20 determines that the user has issued a movement instruction, for example, when an operation of pushing a movement start button (an example of the operation unit 30) of a graphical user interface (GUI) has been performed, or when a movement instruction has been inputted from an input device.

When the control unit 20 has determined that the movement instruction has been issued (Yes in S400), the control unit 20 controls the sample stage 13 so that the sample S moves to the phase plate observation position (S402). Next, the control unit 20 controls the phase plate moving mechanism 16 so that the phase plate 15 moves by a set movement amount (S404), and acquires a phase plate image (S406). Next, the control unit 20 determines whether or not the phase plate 15 has unevenness based on the phase plate image (S408).

When the control unit 20 has determined that the phase plate 15 has unevenness (Yes in S408), the control unit 20 returns to step S404 and controls the phase plate moving mechanism 16 so that the phase plate 15 moves by the set movement amount. Then, the control unit 20 acquires the phase plate image again (S406), and determines the presence or absence of unevenness on the phase plate 15 (S408).

When the control unit 20 has determined that the phase plate 15 has no unevenness (No in S408), the control unit 20 controls the sample stage 13 so that the sample S moves from the phase plate observation position to the image capturing position (S410).

The processes of step S402, step S404, step S406, step S408, and step S410 described above are performed in the same manner as the processes of step S106, step S108, step S110, step S112, and step S114 illustrated in FIG. 2.

When moving the sample S to the image capturing position, the control unit 20 performs a process of causing the display unit 32 to display a notification indicating that the movement of the phase plate 15 is completed (S412). As a result, the user can know that the movement of the phase plate 15 is completed, and can capture a phase difference image.

The phase plate 15 can be moved by the above-described process.

4.3. Features

The electron microscope according to the fourth embodiment has, for example, the following features.

In the electron microscope according to the fourth embodiment, as in the electron microscope according to the first embodiment, since the phase plate image acquisition process (S406), the unevenness determination process (S408), and the moving mechanism control process (S404) are included, a phase difference image can be acquired while avoiding the place where unevenness is present on the phase plate 15. Therefore, a satisfactory phase difference image can be easily acquired.

5. Modification Examples

The invention is not limited to the above-described embodiments, and various modifications can be made within the scope of the invention.

For example, in the first embodiment described above, as illustrated in FIG. 1, the case where the electron microscope 100 is a transmission electron microscope (TEM) has been described, but the electron microscope 100 may be a scanning transmission electron microscope (STEM). When the electron microscope 100 is an STEM, the phase plate 15 is disposed on the front focal plane of the objective lens 14, and the sample S is irradiated with a phase-modulated electron beam. The same applies to the electron microscopes according to the second to fourth embodiments.

Further, for example, in the above-described first embodiment, as illustrated in FIG. 2, the case where the image capturing is repeatedly performed while moving the sample S to obtain a large number of TEM images has been described. However, a large number of TEM images may be acquired by repeatedly capturing images, for example, while inclining the sample S.

In this case, in the process of acquiring a sample image (S100), the control unit 20 controls the sample stage 13 so that the sample image can be captured at a new inclination angle, and acquires the sample image captured by the detector 19.

The second embodiment and the third embodiment can also be likewise applied to the case where a large number of TEM images are acquired by repeatedly performing image capturing while inclining the sample S.

In the first embodiment described above, for example, the control unit 20 performs the process (S112) of determining whether or not the phase plate 15 has unevenness based on a phase plate image, as illustrated in FIG. 2, but the user may also determine whether or not the phase plate 15 has unevenness by looking at the phase plate image. The same applies to the second to fourth embodiments.

In the second embodiment described above, for example, the control unit 20 performs the process (S208) of determining whether the phase shift in the phase plate 15 is normal or abnormal based on the phase difference image, as illustrated in FIG. 5. However, the user may also determine whether the phase shift is normal or abnormal by looking at the phase plate image. The same applies to the third embodiment.

The embodiments and modification examples which are described hereinabove are merely exemplary and are not intended to be limiting. For example, the embodiments and modification examples can be combined as appropriate.

The invention includes configurations substantially the same as the configurations described in the embodiments (for example, configurations having the same function, method and result, or configurations having the same purpose and effect). The invention is also inclusive of configurations in which nonessential parts of the configurations described in the embodiments are replaced. The invention is also inclusive of configurations that can achieve the same effects or the same objects as the configurations described in the embodiments. Further, the invention is inclusive of configurations in which known features are added to the configurations described in the embodiments.

Although the embodiments of the invention have been described in detail hereinabove, it can be readily understood by a person skilled in the art that many modifications can be made without departing substantially from the novel features and effects of the invention. Therefore, all such modifications are intended to be included in the scope of the invention.

The invention claimed is:

1. An electron microscope comprising:
an electron microscope main body comprising a phase plate that imparts a phase change to an electron wave, a moving mechanism that moves the phase plate, and a detector that acquires an image formed by an electron beam transmitted through a sample; and
a control unit that controls the electron microscope main body,
the control unit configured to perform:
a phase plate image acquisition process of acquiring a phase plate image which is an image of the phase plate;
an unevenness determination process of determining whether or not the phase plate has unevenness based on the phase plate image; and
a moving mechanism control process of moving the phase plate by controlling the moving mechanism when the control unit has determined that the unevenness is present.

2. The electron microscope according to claim 1, wherein the control unit is further configured to perform: a phase shift determination process of determining whether a phase shift by the phase plate is normal or abnormal; and
the control unit is configured to perform: the moving mechanism control process when the control unit has determined that the phase shift is abnormal.

3. The electron microscope according to claim 2, wherein the control unit is configured to perform the phase plate image acquisition process and the unevenness determination process after the moving mechanism control process.

4. The electron microscope according to claim 3, wherein the control unit is further configured to perform a sample image acquisition process of acquiring a sample image when the control unit has determined that the phase plate has no unevenness.

5. The electron microscope according to claim 4, wherein the control unit is further configured to perform, before the phase shift determination process, a condition determination process of determining whether a condition on which the phase plate properly functions is satisfied; and
the control unit is configured to perform the sample image acquisition process when the control unit has determined that the condition is satisfied, or performs the phase shift determination process when the control unit has determined that the condition is not satisfied.

6. The electron microscope according to claim 1, wherein the control unit is further configured to perform a condition determination process of determining whether a condition on which the phase plate properly functions is satisfied; and
the control unit is configured to perform a sample image acquisition process of acquiring a sample image when the control unit has determined that the condition is satisfied, or performs a moving mechanism control process when the control unit has determined that the condition is not satisfied.

7. The electron microscope according to claim 6, wherein the control unit is configured to perform the phase plate image acquisition process and the unevenness determination process after the moving mechanism control process.

8. The electron microscope according to claim 6, wherein the control unit is configured to perform the sample image acquisition process when the control unit has determined that the phase plate has no unevenness.

* * * * *